METHOD FOR MAKING TRANSISTORS INCLUUDING BASE SHEET RESISTIVITY DETERMINING STEP

Filed Jan. 26, 1971

2 Sheets-Sheet 1

INVENTORS.
Willem G. Einthoven,
Evelyn S. Jetter, and
Carl F. Wheatley, Jr.
BY [signature]
ATTORNEY INVENTORS
Willem G. Einthoven,
Evelyn S. Jetter, and
Carl F. Wheatley, Jr.
BY H. L. Allen
ATTORNEY United States Patent Office 3,676,229

Patented July 11, 1972

3,676,229

METHOD FOR MAKING TRANSISTORS INCLUDING BASE SHEET RESISTIVITY DETERMINING STEP

Willem Gerard Einthoven, Belle Mead, Evelyn Speter Jetter, East Brunswick, and Carl Franklin Wheatley, Jr., Somerset, N.J., assignors to RCA Corporation Filed Jan. 26, 1971, Ser. No. 109,783
Int. Cl. H01l 7/44
U.S. Cl. 148—186 7 Claims

ABSTRACT OF THE DISCLOSURE

A semiconductor wafer has a uniformly thick collector layer therein with a uniformly thick base layer adjacent the collector layer. A plurality of emitter regions are diffused into the base layer from the surface. During emitter diffusion, an annular region of the same conductivity as the emitter regions is also diffused into the base layer to surround a portion of the base layer at the surface. The sheet resistivity of the base layer between the annular region and the collector layer is determined, and if below a desired minimum, the emitter and annular regions are further diffused.

BACKGROUND OF THE INVENTION

The present invention relates to a method for making semiconductor devices and, more particularly, relates to transistor fabrication techniques which allow the base sheet resistivity underneath the emitter of each transistor to be determined during the fabrication process.

The semiconductor industry presently employs a wide variety of well-known methods for making transistors wherein a large number of devices are made simultaneously on a single semiconductor wafer. However, several of these well-known processes are alike in that before the semiconductor wafer is metallized and diced into individual transistors, the wafer has a uniformly thick collector layer, a uniformly thick base layer adjacent the collector layer, and a plurality of spaced emitter regions diffused into the base layer.

The characteristics of transistors made by such methods are related to the sheet resistivity (sheet rho) of that portion of the base layer between each diffused emitter and the collector layer; therefore it is desirable to measure the sheet resistivity of this portion of the base layer after the emitter diffusion, and before the wafer is metallized and dice. Thus, if the base sheet resistivity between the emitters and the collector layer is too low, the emitters may be rediffused until the desired sheet rho is achieved. However, in those processes characterized as above, the sheet resistivity of the base layer between the emitter and the collector layer is difficult to measure because the base layer can only be probed at the more highly conductive surface, resulting in a reading of surface resistivity, rather than the sheet resistivity beneath the emitter. It is therefore desirable to devise means which allow the sheet resistivity of the base layer between the emitter region and collector layer to be determined after the emitter diffusion step.

SUMMARY OF THE INVENTION

The present invention is a method for making a plurality of transistors from a semiconductor wafer having a surface, with a uniformly thick collector layer in the body and a uniformly thick base layer adjacent the collector and extending to the surface. The method comprises the following steps. First, a plurality of separate emitter regions of the same conductivity as the collector layer are diffused into the base layer from the surface. Second, at least one annular region of the same conductivity as the emitters is diffused into the base layer from the surface to the same depth as the emitter regions. Third, the sheet resistivity of the base layer between the annular region and the collector layer is determined, and if below a desired minimum, the emiter and annular regions are again diffused. The water is then separated into a plurality of transistors, each of which includes a portion of the collector and base layers, and at least one of the emitter regions.

THE DRAWING

DETAILED DESCRIPTION

The steps in the method of the present invention will now be described with reference to FIGS. 1–6, which illustrate the application of the present invention in making single diffused, planar NPN transistors. However, it will be understood that PNP devices may also be made by this method, and that the use of the method is not limited to single diffused devices; for example, the method is also compatible with epitaxial and multiple-diffused techniques.

Figure 1:
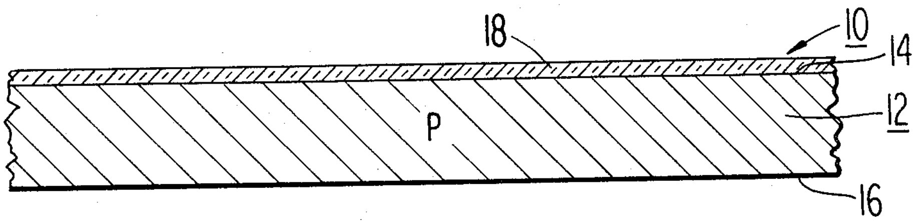
FIGS. 1 to 3 are cross-sectional views of a semiconductor wafer illustrating successive steps in the method of the present invention.

Referring now to FIG. 1, the starting mterial is a P type semiconductor wafer 10 having upper and lower surfaces 14 and 16 respectively, with a thin insulating coating 18 on the upper surface 14. A portion of the P type wafer 10 serves as a base layer 12 for all of the transistors made from the wafer. For example, the wafer 10 may comprise a silicon disc which is about 5.0–9.0 mils thick, and 2.0 inches in diameter; the insulating coating 18 may comprise silicon dioxide, and is about 10,000–20,000 A. thick.

Figure 2:
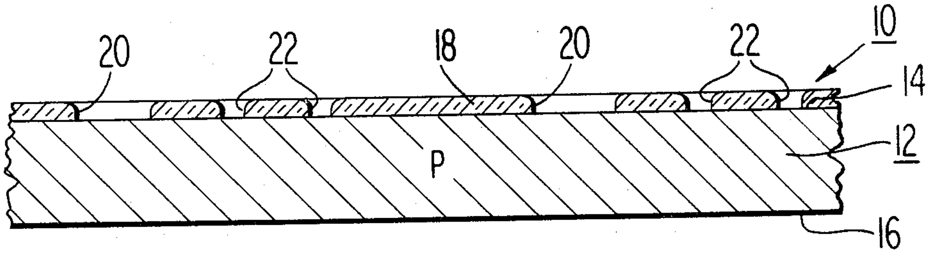
Figure 3:
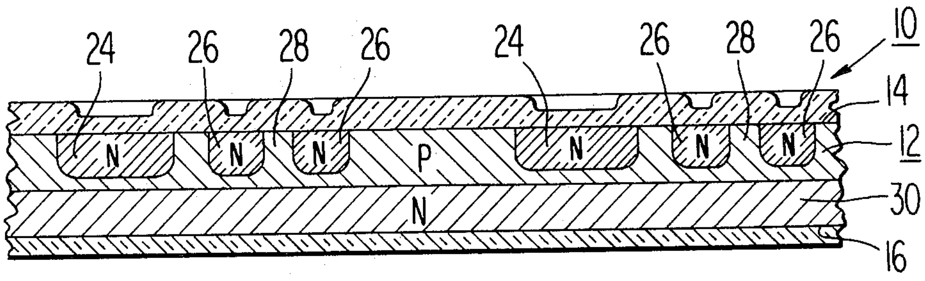

As shown in FIG. 2, the insulating coating 18 is treated with a photoresist-etch sequence to open a plurality of emitter apertures 20 to expose portions of the wafer 10 at the surface 14. During this step, a plurality of annular openings 22 are also provided in the coating 18 to expose other portions of the P type wafer 10 at the surface 14. In this example, the annular openings 22 are "ring-shaped" openings; that is, a ring having an inner and outer radius with a common center, with the coating 18 removed in the ring between the two radii.

Figure 4:
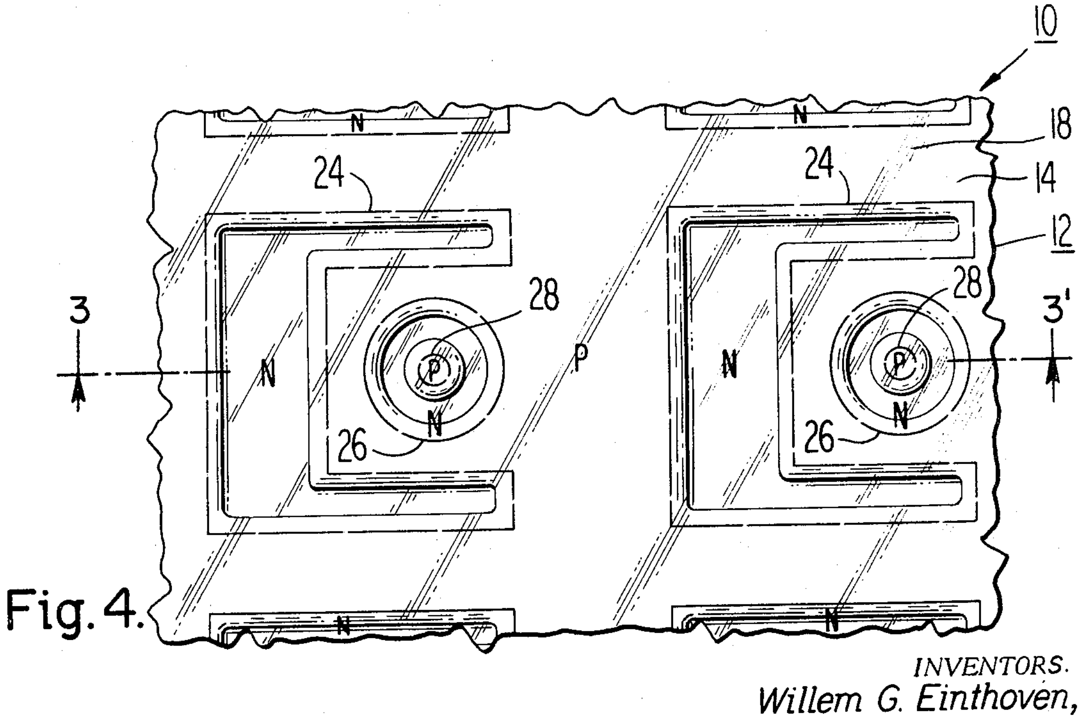
FIG. 4 is a top plan view of the semiconductor wafer illustrated in FIG. 3.

The wafer 10 is then placed in a diffusion furnace (not shown) and exposed to an N type impurity source, such as phosphorus oxychloride, for a period of time to diffuse an N type emitter region 24 (FIG. 3) through each emitter aperture 20 and into the base layer 12 from the upper surface 14. Simultaneously, a ring-shaped N type region 26 is diffused through each ring-shaped opening 22 into the base layer 12, and thus surrounds a portion 28 of the base layer 12 at the surface 14. A top view of the surrounded portion 28 is shown in FIG. 4. Further, a uniformly thick N type collector layer 30 (FIG. 3) is also diffused into the wafer 10 from the lower surface 16. During the N type diffusion, a thin coating of phosphorus glass is deposited over the original insulating coating 18, in the emitter apertures 20 and the ring-shaped openings 22, and on the lower surface 16.

Figure 5:
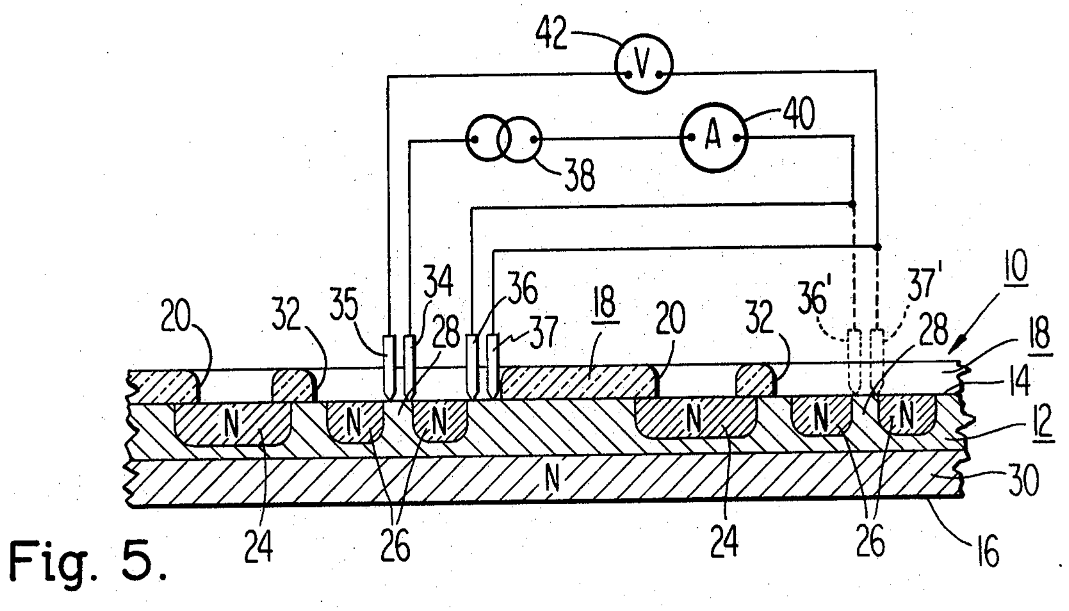
FIGS. 5 and 6 are cross-sectional views illustrating further steps in the method of the present invention.

Referring now to FIG. 5, the composite insulating coating 18 is treated with a photoresist-etch sequence to reopen the emitter apertures 20. Simultaneously, a large area opening 32 is made in the coating 18; this opening need only be sufficiently large to expose the surrounded portion 28 at the upper surface 14. In this example, the large area opening 32 exposes the ring-shaped region 26, the associated surrounded portion 28, and a portion of the base layer 12 at the upper surface 14 which is outside the ring-shaped region 26.

Noting FIG. 5, a test circuit is then used to measure the sheet resistivity of the P type base layer 12 between one or more of the ring-shaped regions 26 and the collector layer 30. The circuit includes first and second probes 34 and 36, and a DC current source 38 having one of its electrodes coupled to the first probe 34. The other electrode of the DC current source 38 is coupled in a series with an ammeter 40, which is, in turn, coupled to the second probe 36. A voltmeter 42 is shunted across third and fourth probes 35 and 37. In making the sheet resistivity measurement, the first and third probes 34 and 35 are placed in contact with one of the surrounded portions 28 at the upper surface 14. The second and fourth probes 36 and 37 contact any other point on the base layer 12 which is outside of the ring-shaped region 26.

After current flow has been established between the first and second probes 34 and 36 for a time, steady-state current and voltage readings will appear on the ammeter 40 and at the voltmeter 42, respectively. Applying Ohm's Law, the total resistance ($R_t$) in ohms, between each two-probe combinations (34–35 and 36–37) is thus equal to the reading of the voltmeter 42 (in volts), divided by the reading of the ammeter 40 (in amperes). If the annular region used to isolate a portion of the base layer 12 is ring-shaped, as has been described above, the sheet resistivity of the base layer 12 between the ring-shaped region 26 and the collector layer 30 is given by the following known expression:

$$\rho_{sh}=\frac{2\pi R_t}{\ln(r_o/r_i)}$$

where:

$\rho_{sh}$=sheet resistivity of the base layer between the annular region and the collector layer,
$R_t$=total resistance between each two-probe combination,
$r_o$=outer radius of the ring-shaped annular region, and
$r_i$=inner radius of the ring-shaped annular region.

After the N type diffusion, the dimensions between the collector layer 30 and the emitter and annular regions 24 and 26 are the same; therefore, the sheet resistivity measurement ($\rho_{sh}$) will apply equally to the sheet resistivity of the base layer 12 underneath each emitter region 24. If the sheet resistivity measurement is below a desired minimum, the wafer 10 may be returned to the furnace so that the emitter and ring-shaped regions can be further diffused; afterwards, the sheet resistivity measurement is again made. This sequence is continued, as required, until the desired sheet resistivity is achieved. It will be appreciated that this technique permits the control of the base sheet resistivity between the emitters and the collector layer during the fabrication process.

Figure 6:
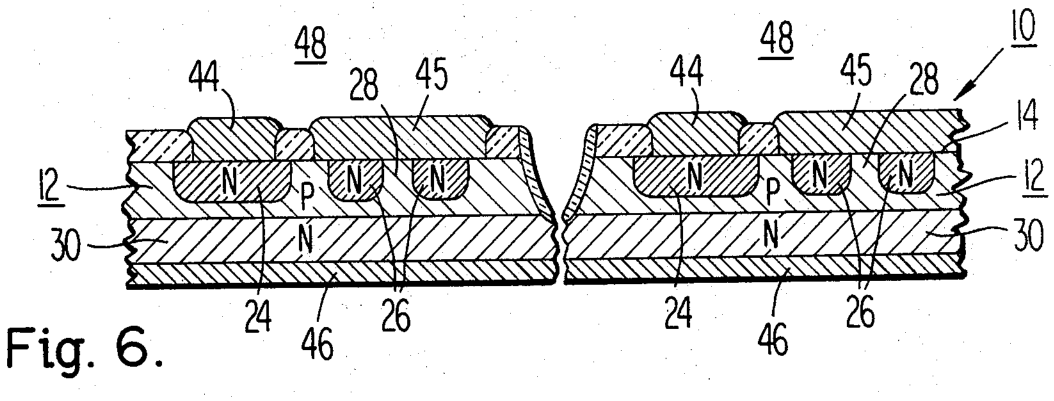

As shown in FIG. 6, the wafer 10 is then provided with metallic emitter, base, and collector contacts 44–46, respectively; the base contact 45 is deposited over the surrounded region 28, the ring-shaped region 26, and that portion of the base layer 12 around the ring-shaped region, in order to avoid the effects of the ring-shaped region during device operation. The wafer is diced into individual transistors 48, each transistor including a portion of the N type collector layer 30, a portion of the P type base layer 12, one of the emitter regions 24, and one of the ring-shaped regions 26.

An alternative method for measuring the base sheet resistivity between the ring-shaped regions 26 and the collector layer 30 is also shown in FIG. 5. In this alternative method, the second and fourth probes (designated as 36' and 37' and shown by dotted line in FIG. 5) are placed in contact with the surrounded portion 28 associated with a second one of the ring-shaped regions 26. The total resistance $R_t$ between each two-probe combination is again measured in the same manner as described above. However, since this total resistance measurement represents the resistance between two of the ring-shaped regions 26 and the collector layer 30, then the resistance associated with one of the ring-shaped regions 26 is one-half of the total; thus, the expression for $\rho_{sh}$ measured in this manner is:

$$\rho_{sh}=\frac{\pi R_t}{\ln(r_o/r_i)}$$

The annular region has been described in the above example as a ring-shaped region, and it will be understood that the above expression for $\rho_{sh}$ applies only to such ring-shaped regions. However, other annular-shaped regions are also suitable, as long as the region closes on itself and surrounds a portion of the base layer. The $\rho_{sh}$ expressions for other annular-shaped regions are known, or may be determined from known criteria.

We claim:

1. A method for making a plurality of transistors from a semiconductor wafer having a surface, with a collector layer of one conductivity type within the wafer, and a base layer of an opposite conductivity type within the wafer adjacent the collector layer and extending to the surface, said method comprising the steps of:
diffusing a plurality of separate emitter regions of said one conductivity type into said base layer from said surface;
diffusing an annular region of said one conductivity type into said base layer from said surface to the same depth as said emitter regions;
determining the sheet resistivity of said base layer between said annular region and said collector layer; and
separating said wafer into a plurality of transistors, each transistor including a portion of said collector and base layers and at least one of said emitter regions.

2. A method according to claim 1, including the additional step of rediffusing said emitter regions and said annular region before said separating step, when the sheet resistivity of said base layer is determined to be below a desired minimum.

3. A method according to claim 1, wherein said emitter regions and said annular region are simultaneously diffused into said base layer.

4. A method according to claim 3, wherein said annular region is ring-shaped and surrounds a portion of said base layer at said surface, and wherein said sheet resistivity determining step comprises:
measuring the total resistance between said surrounded portion and any other point on said surface of said base layer, and
computing the sheet resistivity of said base layer underneath said ring-shaped region from the following expression $$\rho_{sh}=\frac{2\pi Rt}{\ln(r_o/r_i)}$$

where:
$\rho_{sh}$=sheet resistivity of said base layer under said ring-shaped region,
$R_t$=total resistance between said surrounded portion and said other point,
$r_o$=outer radius of said ring-shaped region, and
$r_i$=inner radius of said ring-shaped region.

5. A method according to claim 4, further including the step of depositing a conductive layer on said surface over said base layer, said surrounded portion, and said ring-shaped region, before said separating step.

6. A method for making a plurality of transistors from a semiconductor wafer having a surface, with a collector layer of one conductivity type within the wafer and a base layer of an opposite conductivity type within the wafer adjacent the collector layer and extending to the surface, said method comprising the steps of:
diffusing a plurality of separate emitter regions of said one conductivity type into said base layer from said surface;

diffusing a plurality of annular regions of said one conductivity type into said base layer from said surface to the same depth as said emitter regions, each said annular region being adjacent to one of said emitter regions;

determining the sheet resistivity of said base layer between said annular regions and said collector layer;

depositing a conductive layer on said surface over said base layer and each said annular region; and separating said wafer into a plurality of transistors, each transistor including a portion of said collector and base layers, and at least one of said emitter and annular regions.

7. A method according to claim 6, wherein said annular regions are ring-shaped and surround a portion of said base layer at said surface, and wherein said sheet resistivity determining step comprises:

measuring the total resistance between the surrounded portions of two of said ring-shaped regions, and computing the sheet resistivity of said base layer underneath one of said ring-shaped regions from the following expression $$\rho_{sh}=\frac{\pi R_t}{\ln(r_o/r_i)}$$

where:

$\rho_{sh}$=sheet resistivity of said base layer under the annular region, $R_t$=total resistance between said two surrounded portions, $r_o$=outer radius of said ring-shaped region, and $r_i$=inner radius of said ring-shaped region.

References Cited

UNITED STATES PATENTS

| | | | |
|---|---|---|---|
| 3,134,077 | 5/1964 | Hutchins et al. | 29—574 UX |
| 3,304,594 | 2/1967 | Madland | 148—186 X |
| 3,465,427 | 9/1969 | Barson et al. | 148—186 X |
| 3,578,514 | 5/1971 | Lesk | 148—175 |

FOREIGN PATENTS

| | | | |
|---|---|---|---|
| 993,388 | 5/1965 | Great Britain | 148—186 |

OTHER REFERENCES

Motorola, Integrated Circuits, McGraw-Hill Book Co., New York (1965), pp. 80–82, 108 and 109.

GEORGE T. OZAKI, Primary Examiner

U.S. Cl. X.R.

29—574; 148—187, 189